United States Patent
Bruendel et al.

(10) Patent No.: US 8,759,988 B2
(45) Date of Patent: Jun. 24, 2014

(54) METHOD FOR PRODUCING SEMICONDUCTOR COMPONENTS, AND CORRESPONDING SEMICONDUCTOR COMPONENT

(75) Inventors: Mathias Bruendel, Stuttgart (DE); Frieder Haag, Wannweil (DE); Ulrike Scholz, Komtal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/117,240

(22) Filed: May 27, 2011

(65) Prior Publication Data
US 2011/0291301 A1 Dec. 1, 2011

(30) Foreign Application Priority Data
Jun. 1, 2010 (DE) .......................... 10 2010 029 550

(51) Int. Cl.
- *H01L 23/48* (2006.01)
- *H01L 23/34* (2006.01)
- *H01L 33/00* (2010.01)
- *H01L 31/0203* (2014.01)

(52) U.S. Cl.
USPC ........... 257/783; 257/723; 257/738; 257/773; 257/99; 257/434

(58) Field of Classification Search
None
See application file for complete search history.

(56) References Cited

U.S. PATENT DOCUMENTS

| | | | |
|---|---|---|---|
| 2007/0085222 A1* | 4/2007 | Zhou et al. | 257/782 |
| 2008/0265421 A1* | 10/2008 | Brunnbauer et al. | 257/758 |
| 2009/0039496 A1* | 2/2009 | Beer et al. | 257/693 |
| 2010/0127386 A1* | 5/2010 | Meyer-Berg | 257/698 |
| 2010/0200538 A1* | 8/2010 | Petisce et al. | 216/13 |
| 2012/0258571 A1* | 10/2012 | Beer et al. | 438/107 |

FOREIGN PATENT DOCUMENTS

DE 102007020656 11/2008

* cited by examiner

*Primary Examiner* — Julio J Maldonado
*Assistant Examiner* — Harpreet Singh
(74) *Attorney, Agent, or Firm* — Maginot, Moore & Beck

(57) ABSTRACT

A method for producing semiconductor components and a component obtainable by such a method is disclosed. The method comprises the following steps: fixing a conductive film on a carrier; adhesively bonding semiconductor chips onto the conductive film using an adhesive layer, wherein active surfaces of the semiconductor chips, the active surfaces having connection contacts, are situated on that side of the chips which faces the film; overmolding the chips adhesively bonded onto the conductive film with a molding compound; and releasing the conductive film with the overmolded chips from the carrier. In this case, the adhesive layer is structured in such a way that at least connection contacts of the semiconductor chips are free of the adhesive layer and are kept free of the molding compound.

3 Claims, 4 Drawing Sheets

METHOD FOR PRODUCING SEMICONDUCTOR COMPONENTS, AND CORRESPONDING SEMICONDUCTOR COMPONENT

This application claims priority under 35 U.S.C. §119 to patent application no. DE 10 2010 029 550.7, filed Jun. 1, 2010 in Germany, the disclosure of which is incorporated herein by reference in its entirety.

BACKGROUND

The present disclosure relates to a method for producing semiconductor components, and a semiconductor component obtainable by such a method.

In consumer electronics (CE), microelectronic components (integrated circuits; IC) for the first-level package are generally arranged alongside one another or one above another on a leadframe (quad flat pack no lead; QFN) or laminate substrate (leadless grid array; LGA or ball grid array; BGA) and contact-connected by means of wire bonding or flip-chip techniques. After chip mounting, the leadframe or the laminate substrate is encapsulated with molding compound by injection molding and singulated by means of sawing. These arrangements are soldered onto the second-level printed circuit board in a reflow soldering method.

The so-called "leadless" housings, such as e.g. LGA or QFN, are increasingly superseding the conventional housings having pins, such as small outline integrated circuit (SOIC) or plastic leaded chip carrier (PLCC).

The LGA technique is a serial packaging process comprising die attach, wire bonding and molding, also called transfer molding. Moreover, a comparatively large amount of space is required in the package for the wire bonding connections. In the course of progressive miniaturization, new packaging approaches are being pursued for applications appertaining to microelectronics. In so-called "embedded wafer level ball grid array" methods, the chips, in a "pick and place" process, are placed with the active surface downward onto a carrier provided with a two-sided adhesive film, and are subsequently overmolded. This gives rise to a so-called composite wafer or reconfigured wafer (reconstituted wafer) in the shape of a plastic wafer, preferably in wafer form, in which the chips are embedded. This plastic wafer is then removed from the carrier, as a result of which connections of the chips are exposed. A redistribution wiring can then be carried out as a result. The conventional thin-film technologies and materials are used for the redistribution wiring. The connection pads, also called connection contacts, of the composite wafer are subsequently provided with solder bumps. The components are singulated from the composite wafer by means of sawing.

DE 10 2007 020 656 A1 discloses a workpiece comprising semiconductor chips and a method for producing such a workpiece. The production method comprises the steps of providing at least two semiconductor chips having a first main surface and a second main surface, positioning the semiconductor chips with their first main surfaces on the top side of a carrier plate, applying an electrically conductive layer to regions of the second main surfaces, and applying a potting compound to the electrically conductive layer.

SUMMARY

The method according to the disclosure for producing semiconductor components and the semiconductor component obtainable by such a method provide an extremely miniaturizable chip package which has the advantage that the sensitive chip surfaces are already protected against ambient influences and contamination directly after molding. Moreover, they afford a cost-effective alternative to the thin-film technique requiring clean room technologies. At the same time, there is the possibility of producing a media access to embedded chips in a simple manner.

The disclosure is based on the insight that the sensitive chip surfaces can be protected in a simple manner by a conductive film being applied to the carrier on which the semiconductor chips are intended to be placed temporarily, and the semiconductor chips being adhesively bonded onto the conductive film with the active surface downward, that is to say facing the conductive film, by means of a structured adhesive layer. By virtue of the fact that a structured adhesive layer is used, connection pads or sensitive regions of the chips can be kept free of adhesive. The chips adhesively bonded onto the conductive film are overmolded. The conductive film with the overmolded chips is then released from the carrier. The active surface of the chips, which is free of molding compound, is completely covered with the conductive film, such that there is no risk of the chip surface being contaminated in this stage. In this context, the term "adhesive bonding" is intended to designate a cohesive connection.

Preferably, release from the carrier is followed by the production of contact-connections for connecting the conductive film to the connection contacts of the semiconductor chips, and the conductive film is subsequently structured before the semiconductor components are singulated.

Advantageous developments and improvements of the respective subject matter of the disclosure are set forth herein.

In one preferred embodiment of the disclosure, the conductive film is fixed on the carrier by means of an adhesive layer. The adhesive layer is an adhesive layer which can be detached without any residues. In this case, the adhesive layer can be detached thermally or, if a transparent carrier is used, by UV irradiation.

The structured adhesive layer for fixing the semiconductor chips on the conductive film can be applied to the conductive film or to the semiconductor chips in the wafer assemblage, that is to say before the chips are singulated. The application of adhesive is therefore a parallel method, which is significantly faster and hence more cost-effective by comparison with the sequential dispensing of adhesive.

The structured application of the adhesive layer can be effected by means of screen printing. It is also possible, for example by using photopatternable adhesives, firstly to apply the adhesive and then to structure it. In any event the adhesive layer between conductive film and chip surface is structured before chips are fixed on the conductive film, with the result that subsequent structuring of the adhesive, for example by means of a laser, which entails the risk of damage to the semiconductor chips, can be obviated. Lithography methods known from printed circuit board technology can be used for the structuring of the conductor tracks.

The structuring of the adhesive layer pursues a number of goals. Firstly, the connection pads of the chips are kept free of adhesive. This means that later it is simpler to produce plated-through holes from the conductive film to the connection pads. Secondly, sensitive regions of the semiconductor chip can be kept open.

BRIEF DESCRIPTION OF THE DRAWINGS

Exemplary embodiments of the disclosure are illustrated in the drawings and explained in greater detail in the description below.

In the figures.

DETAILED DESCRIPTION

In the figures, identical reference symbols designate identical or functionally identical components.

Figure 1:
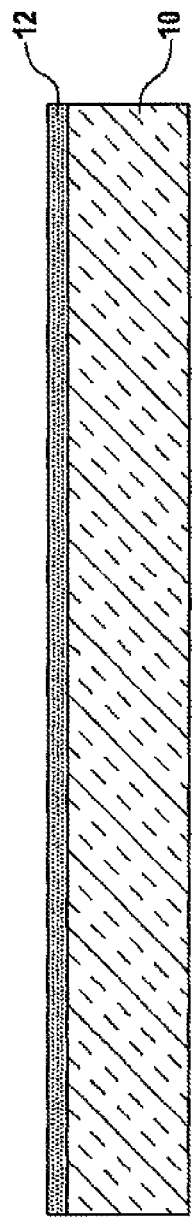
FIG. 1 shows a first stage of the production of an embodiment of a component according to the disclosure in cross-sectional view.

FIG. 1 is a cross-sectional view of a first process stage of a production method in accordance with a preferred exemplary embodiment of the present disclosure.

In accordance with the preferred exemplary embodiment of the disclosure, firstly, an adhesive layer 12 is applied on a carrier plate 10. The adhesive layer 12 is constituted such that it can be detached without any residues. FIG. 1 shows the carrier plate 10 with applied adhesive layer 12.

Figure 2:
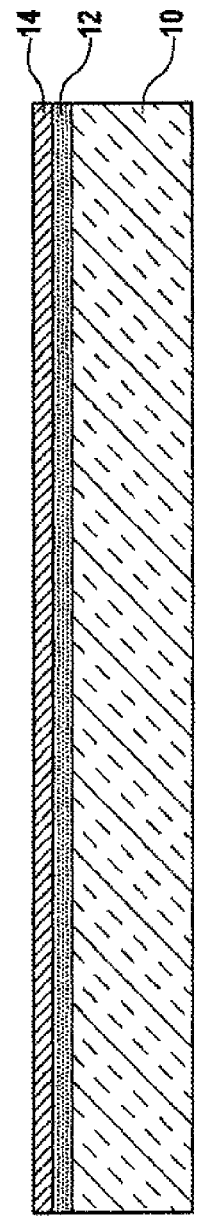
FIG. 2 shows a second stage of the production of an embodiment of a component according to the disclosure in cross-sectional view.

FIG. 2 is a cross-sectional view of a second process stage of the production method in accordance with the preferred exemplary embodiment of the disclosure.

In accordance with the preferred exemplary embodiment, a copper film 14 is fixed on the carrier plate 10 by means of the adhesive layer 12. The carrier plate 10 preferably has wafer form, but can also be processed in other formats.

In a next step, an adhesive layer 16 is applied on a semiconductor wafer and suitably structured. For this purpose, the adhesive is preferably photopatternable. As an alternative thereto, it is also possible, for example, to apply the adhesive by means of screen printing. The adhesive is structured in such a way that connection pads and sensitive regions of the chips situated on the water are kept free of adhesive. The semiconductor wafer is subsequently singulated into individual semiconductor chips.

As an alternative to applying the adhesive on the semiconductor wafer, it is also possible to apply the adhesive to the copper film 14.

Figure 3:
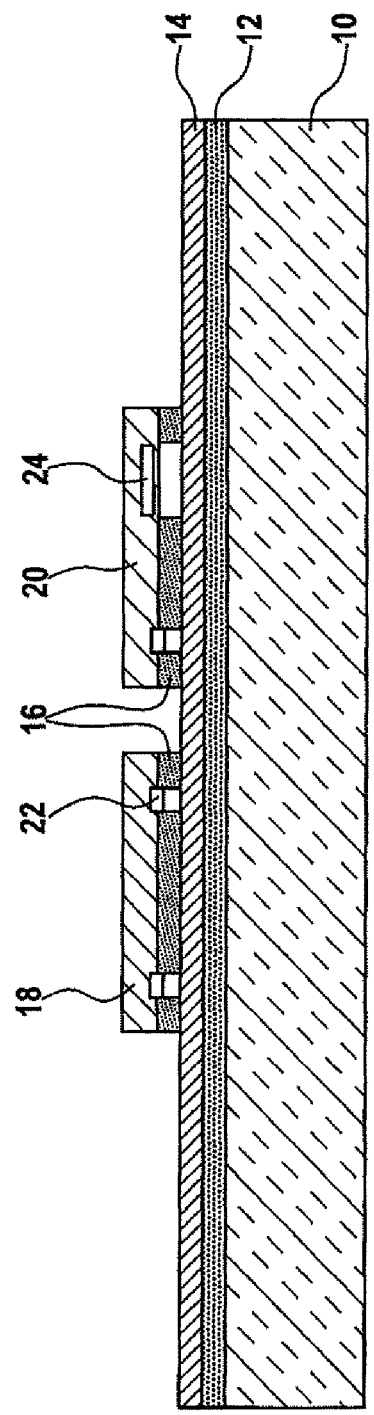
FIG. 3 shows a third stage of the production of an embodiment of a component according to the disclosure in cross-sectional view.

FIG. 3 is a cross-sectional view of a third process stage of the production method in accordance with the preferred exemplary embodiment of the disclosure.

After singulation, semiconductor chips 18 and 20 are adhesively bonded onto the copper film 14 by means of the structured adhesive layer 16 in such a way that the surfaces containing connection pads 22 face toward the film 14, but do not make electrical contact with the latter. In FIG. 3, two chips 18 and 20 can be seen, which were adhesively bonded by means of the structured adhesive layer 16 on the film 14 fixed on the carrier. The present example involves different chips originating from different wafers which were both prepared in accordance with the method according to the disclosure. The chip 18 is an application-specific integrated circuit (ASIC). The chip 20 is a sensor having a sensitive region 24. In this way, associated chips of a module are arranged in combination with one another as early as in the reconfigured wafer.

However, with the method according to the disclosure it is also possible, of course, to produce reconfigured wafers with only one type of chips.

After adhesive bonding onto the copper film 14, the chips 18 and 20 are overmolded with molding compound 26. This can be done by means of a compression, sheet or transfer molding method. In this case, the selection of the molding method and the choice of the processing format can be flexibly coordinated with one another.

Figure 4:
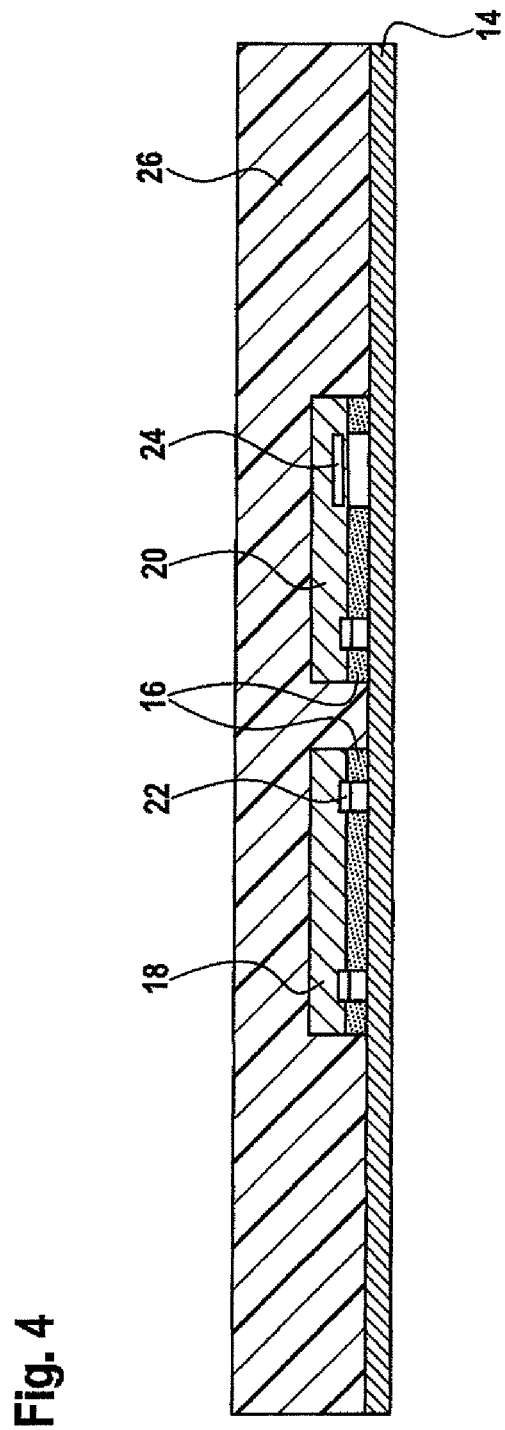
FIG. 4 shows a fourth stage of the production of an embodiment of a component according to the disclosure in cross-sectional view.

FIG. 4 is a cross-sectional view of a fourth process stage of the production method in accordance with the preferred exemplary embodiment of the disclosure.

FIG. 4 shows the reconfigured wafer after separation from the carrier plate 10. The chips 18 and 20 are now embedded into the molding compound 26 and covered by the copper film 14 at the underside.

Figure 5:
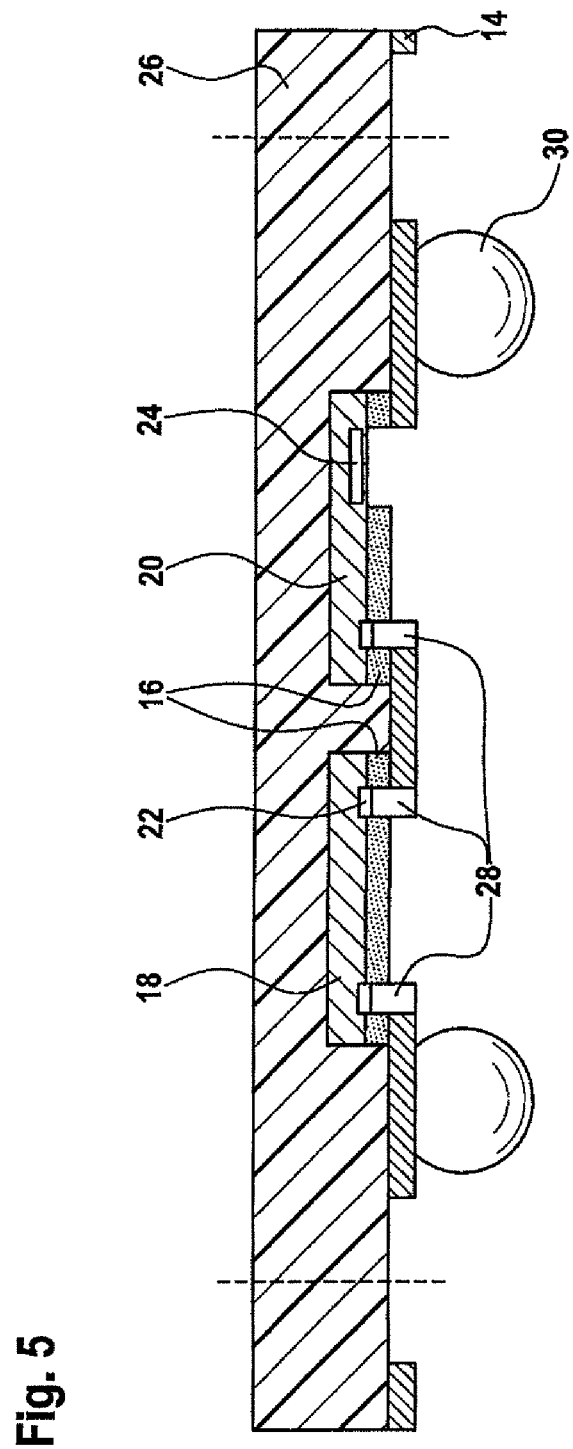
FIG. 5 shows a fifth stage of the production of an embodiment of a component according to the disclosure in cross-sectional view.

FIG. 5 is a cross-sectional view of a fifth process stage of the production method in accordance with the preferred exemplary embodiment of the disclosure.

After the reconfigured wafer has been detached from the carrier plate 10, those regions of the copper film 14 in which a plated-through hole 28 to the connection pads 22 of the chips 18 and 20 is necessary are opened, which is preferably done by lithography and etching, and conductive connections by means of the plated-through holes 28 to the pads are produced. The copper film 14 is subsequently structured in order to produce conductor track connections or external pads, and to free sensitive regions 24 for media access. The metal area is additionally also provided with a suitable, for example solderable, surface and the remaining regions are passivated, for example with soldering resist. Depending on the application, the structured copper pads can be provided with solder balls 30 or be used as LGA connections. Finally, the reconfigured wafer is divided into individual elements along the dashed lines depicted in FIG. 5. This can be done by sawing, laser application, water jet cutting or similar known techniques.

The semiconductor component in accordance with the preferred exemplary embodiment of the disclosure is a sensor module comprising an ASIC chip 18 and a sensor chip 20, which are embedded in molding compound 26 and electrically conductively connected to one another by means of the structured copper film 14. The chips 18 and 20 are additionally connected to solder balls 30 via the structured conductive film 14.

The present disclosure can be used particularly advantageously for multifunctional sensor modules for consumer electronics applications, for example mobile radio applications, personal digital assistant (PDA), laptops, etc., which require a cost-effective package with at the same time an extremely miniaturized structural size. However, it goes without saying that the disclosure is not restricted to sensor chips, but rather is applicable, in principle, to any semiconductor chips.

What is claimed is:

1. A semiconductor component, comprising:
    at least one semiconductor chip including an active surface having connection contacts;
    a molding package, in which the at least one semiconductor chip is embedded into molding compound in such a way that the active surface is embedded within the molding compound with at least the connection contacts are omitted; and
    a wiring for making contact with the connection contacts of the at least one semiconductor chip,
    wherein the wiring comprises a structured conductive film and is directly adhered to the at least one semiconductor chip with a structured adhesive layer, which at least partly covers the active surface, and wherein the adhesive layer is structured in such a way that at least the connection contacts of the semiconductor chips are free of the adhesive layer, wherein the semiconductor chip is a sensor and the structured adhesive layer has cutouts for sensitive regions of the sensor.

2. A semiconductor component, comprising:

at least one semiconductor chip including an active surface having connection contacts;

a molding package, in which the at least one semiconductor chip is embedded into molding compound in such a way that the active surface is embedded within the molding compound with at least the connection contacts are omitted; and a wiring for making contact with the connection contacts of the at least one semiconductor chip, wherein the wiring comprises a structured conductive film and is directly adhered to the at least one semiconductor chip with a structured adhesive layer, which at least partly covers the active surface, and wherein the adhesive layer is structured m such a way that at least the connection contacts of the semiconductor chips are free of the adhesive layer, and wherein at least one further semiconductor chip is provided m the molding package, said at least one further semiconductor chip being electrically connected to the semiconductor chip by means of only the structured conductive film.

3. A semiconductor component, comprising:

at least one semiconductor chip including an active surface having connection contacts;

a molding package, in which the at least one semiconductor chip is embedded into molding compound in such a way that at least the connection contacts are omitted; and a wiring for making contact with the connection contacts of the at least one semiconductor chip, wherein the wiring comprises a structured conductive film and is fixed to the at least one semiconductor chip with a structured adhesive layer which adhesive layer is in direct contact with the semiconductor chip and which adhesive layer at least partly covers the active surface, and wherein the adhesive layer is structured in such a way that at least the connection contacts of the semiconductor chips are free of the adhesive layer.

\* \* \* \* \*

UNITED STATES PATENT AND TRADEMARK OFFICE
CERTIFICATE OF CORRECTION

| | |
|---|---|
| PATENT NO. | : 8,759,988 B2 |
| APPLICATION NO. | : 13/117240 |
| DATED | : June 24, 2014 |
| INVENTOR(S) | : Bruendel et al. |

It is certified that error appears in the above-identified patent and that said Letters Patent is hereby corrected as shown below:

Correction 1: For item (75) of the Title page (Inventors), "Komtal" should be "Korntal".

In the Claims

Correction 2: The term "m" at col 5, ln 22 should be "in".

Correction 3: The term "m" at col 6, ln 2 should be "in".

Signed and Sealed this
Twenty-sixth Day of May, 2015

Michelle K. Lee
*Director of the United States Patent and Trademark Office*